United States Patent [19]

Bolzt et al.

[11] 4,241,436
[45] Dec. 23, 1980

[54] METHOD OF MANUFACTURING OF ELECTRONIC MODULES FOR TIMEPIECES AND ELECTRONIC MODULE OBTAINED BY CARRYING OUT THIS METHOD

[75] Inventors: Jean Bolzt, Neuchâtel; Philippe Clot; Philippe Golay, both of Fontainemelon; Daniel Paratte, Neuchâtel, all of Switzerland

[73] Assignee: Fabrique d'Horlogerie de Fontainemelon S.A., Neuchâtel, Switzerland

[21] Appl. No.: 969,059

[22] Filed: Dec. 13, 1978

[30] Foreign Application Priority Data

Dec. 14, 1977 [CH] Switzerland .................. 15376/77

[51] Int. Cl.³ .................. G04C 23/02; H05K 3/32
[52] U.S. Cl. .................. 368/88; 29/835; 29/177; 368/318
[58] Field of Search .................. 29/626, 627, 177; 174/68.5; 228/6 A; 58/23 R, 23 BA, 88 R

[56] References Cited

U.S. PATENT DOCUMENTS

| | | | |
|---|---|---|---|
| 3,387,365 | 6/1968 | Stelmak | 228/180 A X |
| 3,724,068 | 4/1973 | Galli | 29/626 |
| 3,771,711 | 11/1973 | Lesyk et al. | 29/626 X |
| 4,050,618 | 9/1977 | Angellucci et al. | 228/6 A |
| 4,095,334 | 6/1978 | Uchida | 29/627 |

*Primary Examiner*—Francis S. Husar
*Assistant Examiner*—C. J. Arbes
*Attorney, Agent, or Firm*—Silverman, Cass & Singer, Ltd.

[57] ABSTRACT

An electronic watch module and method of manufacturing the module. The module is formed from a flexible film by forming a set of appropriately located, sized and shaped component openings in the film, forming a second set of terminal lead bonding openings for the components, securing a metallic foil to said film, removing portions of said foil to form a pattern of interconnection leads for said components leaving portions over said bonding openings, locating the components in the respective openings with the component leads in registry with their respective interconnection leads, and bonding the foil leads to the component leads through the bonding openings.

10 Claims, 11 Drawing Figures

METHOD OF MANUFACTURING OF ELECTRONIC MODULES FOR TIMEPIECES AND ELECTRONIC MODULE OBTAINED BY CARRYING OUT THIS METHOD

The present invention relates to a method for the manufacturing of electronic modules for timepieces as well as to an electronic module obtained by carrying out this method.

The electronic modules which are presently known, especially for timepieces, have always a rigid substrate or support, relatively thick, for instance made of an epoxy resin, of a thickness of 5/10 mm, on which or in recesses of which are located the components of the module, especially its integrated circuit when it includes one. The electric connections are formed in different manners but, in most of the cases, by means of a grid embedded in the material of the substrate, which is generally formed by overmolding on the said grid. The substrate is provided with openings rendering accessible elements of the grid at the welding points connecting the connectors of the components of the electronic circuit to the grid.

The present invention is based on the ascertainment of the fact that the substrate of the type as mentioned hereabove is not absolutely necessary, a substrate formed by a flexible film being suitable for constituting the frame or skeleton of the module.

The method according to the invention is characterized by the fact that one formed the electronic modules on a flexible film band, in a continuous process, the said film constituting the very substrate of the finished module.

The electronic module according to the invention, obtained by carrying out this method, is characterized by the fact that its substrate is formed constituted by a flexible film.

The drawing shows, by way of example, one mode of carrying out the method according to the invention.

According to the present method, one uses a film 1 made of plastic material, which is flexible and thin, its thickness being of the order of 50 to 125 microns, provided laterally with two sets of perforations 2, like a cinematographic film, permitting to produce its advance, step by step, during the work, by means of toothed wheels of the installation, the teeth of which engage the said perforations. The teeth and performations permit the precise determination of the position of the film in the different working stations of the machine or machines serving to manufacture, in a continuous process, the modules.

One provides in the film 1 holes or openings 3, by cutting-stamping or by chemical way, for instance, of which a part at least are situated opposite places where the finished module must comprise the weldings connecting its components to electric connectors.

It is to be noted that, among these openings 3, one of them, designated by 3a, is intended to receive, later, an integrated circuit.

One places then, by sticking or adhering, a thin metallic strap or coating 4, for instance made of copper, on the film 1, letting or leaving uncovered the areas which are situated in the vicinity of its two longitudinal ends, where are provided the perforations 2. This metallic coating 4 is intended to constitute the net or grid of the electric connectors of the module, including, at 4a, the connecting element for the feeding battery of the module.

Figure 1:
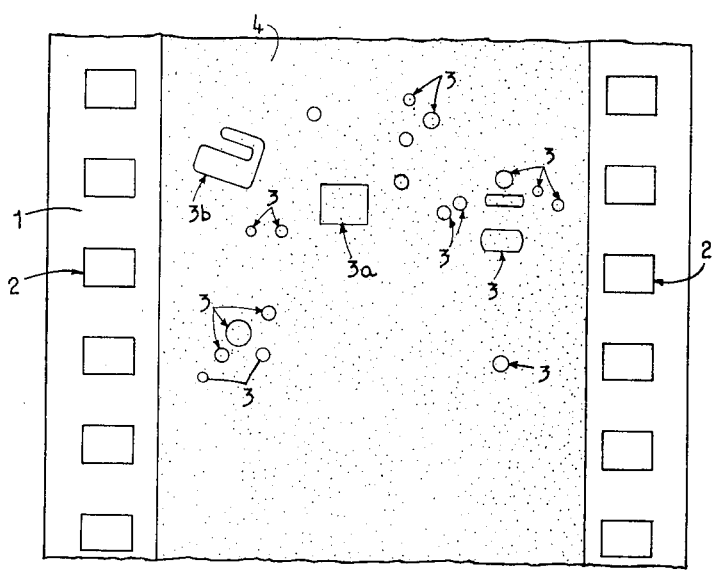
FIGS. 1 to 4 are plan views of a portion of a flexible film in four different stages of the process of manufacturing of the modules.

The film appears then as illustrated in FIG. 1.

The next operation consists in eliminating the metallic coating 4 where its presence is not useful, this elimination being effected by chemical way or means.

It is to be noted that, after a partial elimination, the metallic coating 4 continues to cover some of the openings 3; it forms two bands 4b extending above one of these openings 3, designated by 3b, and it constitutes tongues 4c, an end of which is free, extending above the opening 3a previously mentioned.

Figure 2:
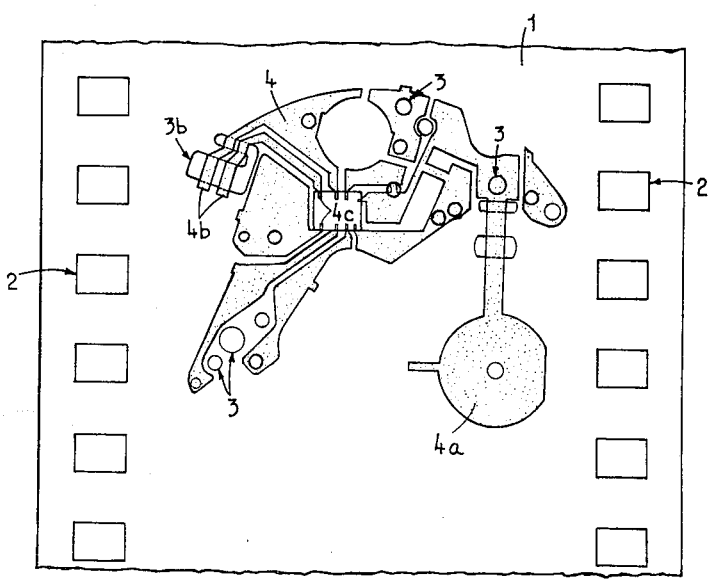
Figure 3:
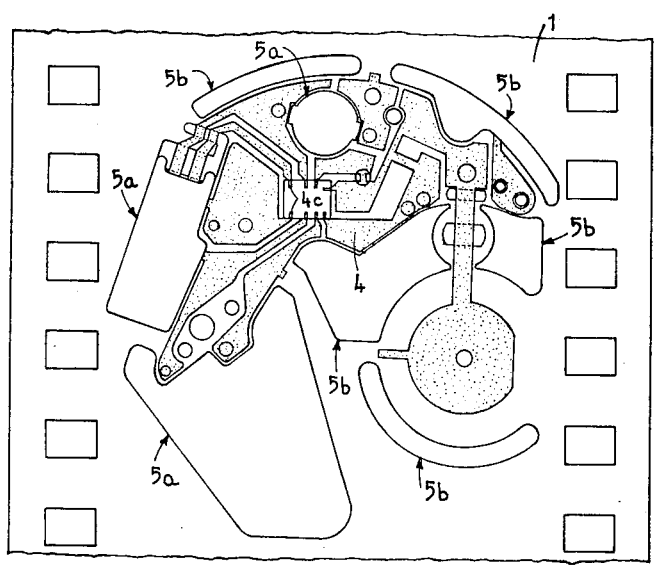

The net or grid of the conductive areas which remain has then the appearance represented in FIG. 2.

By a new operation of cutting-stamping which could be, in some cases, effected at the same time as are obtained the holes or openings 3 previously mentioned, one cuts in the film openings 5a intended to receive later components of the module, as well as openings 5b which are pre-openings of separation of the module from the film.

One places then the integrated circuit 6 which is engaged, without intermediary connectors, into the opening 3a of the film; one secures by welding, for instance by means of tin, its bumbs, that is to say the pearls or beads 7 of gold or of tin which constitute the terminals of this circuit, directly to the tongues 4c of the metallic strap 4 extending above the said opening 3a. Thus, one prevents having to provide the circuit 6 with conductors welded to the said pearls serving to the connection of the module with the grid, as it is usual. In other words, one effects the inner lead bonding (ILB) and one saves the outer lead bonding (OLB), necessary when intermediary connectors are used.

Figure 5:
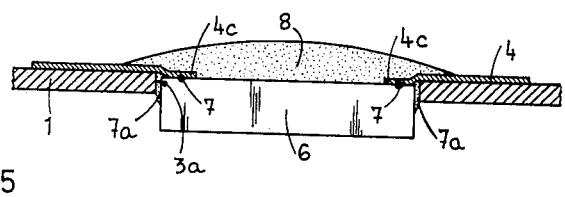
FIG. 5 is a sectional view of a detail of the module at a larger scale.

As shown in the sectional view of FIG. 5, the opening 3a provided in the film 1 for receiving the integrated circuit 6 is slightly larger than the circuit so as to prevent the drop 8 of epoxy resin which is placed on the integrated circuit 6 and on the connecting tongues 4c for protecting them from running under the film 1. Before its polymerisation, the drop 8 maintains itself, by capillarity, at 7a, between the wall of the opening 3a and the integrated circuit 6.

It is to be noted that the integrated circuit could be not engaged into the opening 3a but to be placed on the film opposite this opening, the latter being then slightly smaller than the circuit and giving passage to the tool used for welding the connecting tongues 4c.

One places then the other components of the module in the respective openings of the film 1, that is to say the coil 9 of the motor, with its armature 10, a quartz resonator 11, a variable condenser (trimmer) 12, permitting to adjust the frequency of the resonator and a contact blade 13. The outputs of the components 9, 11 and 12, constituted by wires 14 in the case of the coil 9 and by tongues 15 and 16 in the case of the resonator 11 and of the condenser 12, respectively, are welded to the net 4 of the connectors.

Figure 6:
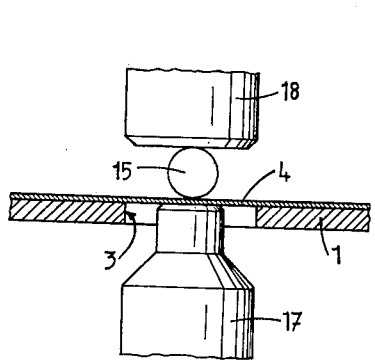
FIG. 6 represents, diagrammatically, one stage of the manufacturing of the module and of the apparatus used at this stage of the manufacturing.

It is to be noted that each point of welding is situated opposite one of the openings provided in the film, that permits to bring electrodes 17 and 18 (FIG. 6) in contact respectively with the coating 4 of conductive material covering the opening 3 and with the output member, for instance one of the tongues 15 of the resonator, of the component of the module. The welding is effected by thermo-compression. As a modification, one could also proceed in the conventional way, by means of tin, for instance.

The blade 13, which is resilient and which belongs to an electric contact closing when the timepiece is reset, is welded directed to the metallic coating 4, through the two openings 3 opposite which is located one of its ends.

Figure 7:
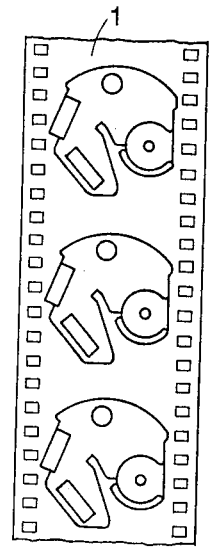
FIG. 7 is a plan view, at a smaller scale than FIGS. 1 to 4, of a portion of a flexible film at the stage of the manufacturing represented in FIG. 4.

The module is then finished, excepted that it is still attached to the film 1, which carries a series of modules as shown in FIG. 7 where a short portion of this film, provided with three modules, has been represented.

Figure 4:
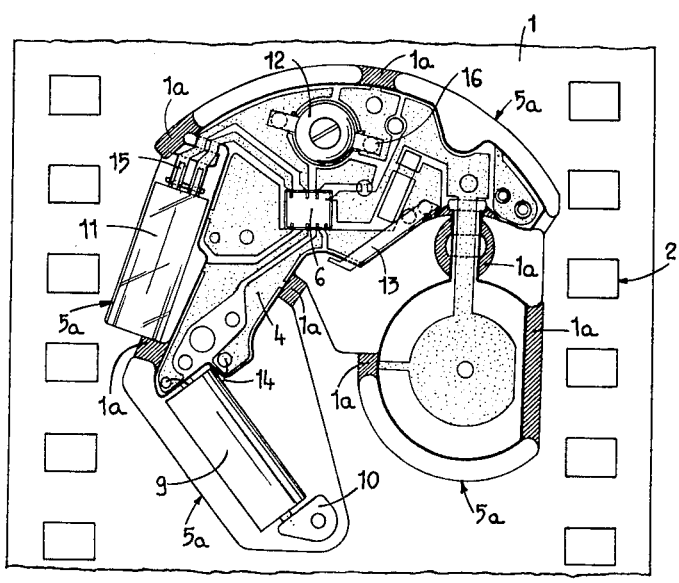

It is then sufficient to eliminate, by an operation of cutting-stamping, the bondings represented by the hatched areas 1a of FIG. 4, which still remain between the pre-openings of separation 5a previously provided for separating each module from the film 1.

Figure 8:
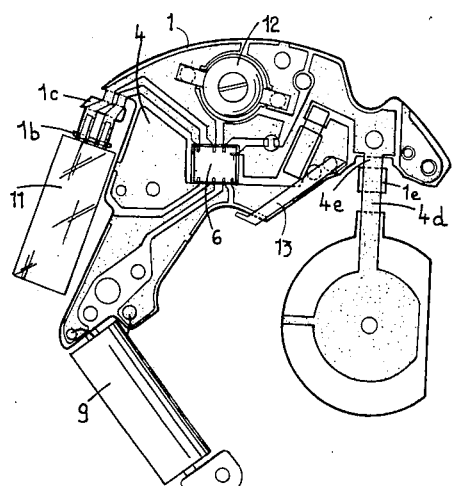
FIG. 8 is a plan view of an electronic module for a finished timepiece, obtained by carrying out the present method.

The finished module appears as represented in FIG. 8.

Figure 9:
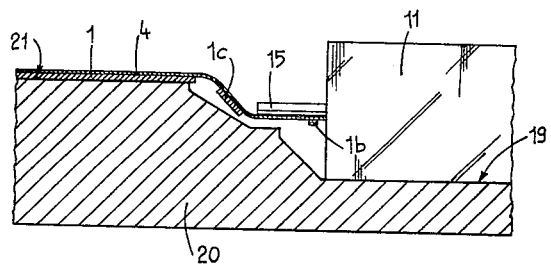
FIG. 9 is a sectional view of a detail of the module, at a larger scale.
Figure 10:
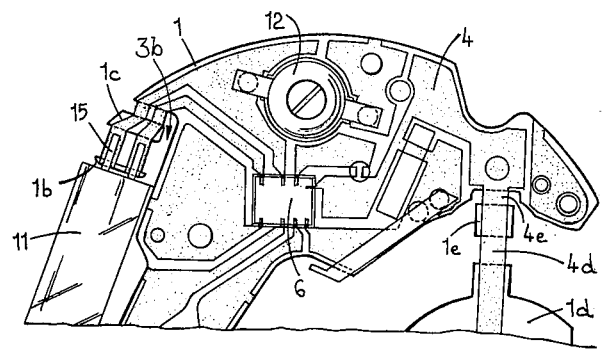
FIG. 10 is a plan view of a detail of the module, also at a larger scale.

Owing to the fact that the metallic strap 4 is flexible, as well as the film 1, it is possible to bend the substrate of the module so as to adapt it to the relief of the frame of the movement of the watch on which it is mounted, that eliminates having to bend the tongues of the components of the modules as it is the case with the rigid substrates. Thus, in the example of FIG. 9, the quartz resonator 11 is placed in the bottom of a recess 9 of the base-plate of the movement, designated by 20, on the face 21 of which is applied the film 1 of the module. One sees that the metallic strap 4 is bent so as to follow the relief of the base-plate. It is to be noted that, owing to the special shape of the aperture 3b (FIGS. 1 and 10) opposite which extend the tongues 15 of the resonator, the film 1 is provided with two portions, designated by 1b and 1c, which are separated from the rest of the film and maintained by the metallic strap 4. These two remaining portions of the film (FIG. 9) have for effect that the bending of the film can be effected only in well determined points thereof.

Figure 11:
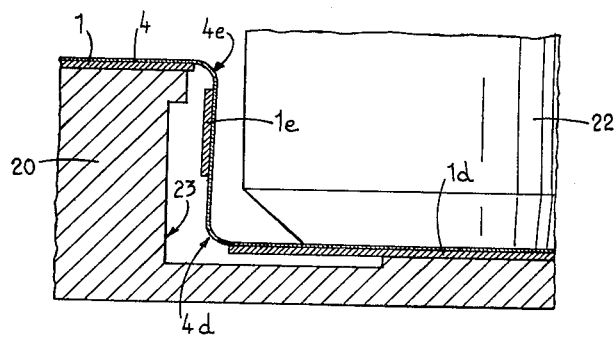
FIG. 11 is a sectional view of a detail of the module at the scale of FIG. 9.

FIG. 11 illustrates the mounting of the feeding battery of the watch movement, designated by 22, located in a recess 23 of the base-plate 20, bearing on the metallic strap 4 bent at right angle in two places 4d and 4e, so as to be able to be adapted to the relief of the base-plate 20. As in the previous case, the film 1 is provided with two portions, separated from the rest of the film, designated by 1d and 1e, situated, the first one, under the battery 22, thus insulating it from the base-plate, and, the second one, on the portion of the metallic strap 4 situated between the elbows 4d and 4e. Owing to this arrangement, the place of the two elbows is well determined.

We claim:

1. A method of manufacturing a module for an electronic timepiece, comprising:
   providing a substrate in the form of an electrically insulating flexible film having a pattern of connection foil leads thereon and a pattern of openings therethrough, with said lead pattern being designed to electrically interconnect components of a module and said opening pattern comprising a first set of component openings conveniently located, sized and shaped for receiving said components and a second set of bonding openings facing locations where said foil leads are to be connected with terminal leads of said components;
   locating said components within said component openings so that said foil leads are registered with appropriate component terminal leads; and
   bonding said foil leads with said terminal leads by bringing a bonding tool into engagement with said foil leads through said bonding openings.

2. A method of manufacturing a module for an electronic timepiece, comprising:
   providing an electrically insulating flexible film;
   forming in said film a first set of component openings conveniently located, sized and shaped for receiving components of a module;
   forming in said film a second set of bonding openings facing locations where terminal leads of said components are to be bonded with interconnection leads;
   securing a metallic foil to said film;
   removing portions of said foil to form a pattern of connection foil leads constituting said interconnection leads, with at least a portion left over each bonding opening;
   locating said components within said component openings so that said foil leads are registered with the appropriate component terminal leads; and
   bonding said foil leads with said terminal leads by bringing a bonding tool into engagement with said foil leads through said bonding openings.

3. A method as claimed in claim 2 including:
   said operations being performed in at least one work station; and
   said film having the shape of a band with lateral perforations along the edges thereof and engaging said perforations to advance the film through said at least one work station.

4. A method as claimed in claim 2 including:
   securing a strap of copper by adhering the strap to said film to form said metallic foil.

5. A method as claimed in claim 2 including:
   chemically removing said foil portions.

6. A method as claimed in claim 2 including:
   bonding said foil leads to said terminal leads by welding.

7. A method as claimed in claim 2 including:
   separating the film from the module including separating some of said connections remaining in said pattern.

8. An electronic watch module comprising:
   an electrically insulating flexible film having a metallic foil secured thereto;
   a plurality of components located in a set of component openings in said film located, sized and shaped for receiving said module components;

a set of bonding openings in said film facing locations where terminal leads of said components are bonded with interconnection leads;

portions of said foil removed to form a pattern of connection foil leads constituting said interconnection leads with at least a portion left over each bonding opening; and said components located within said component openings so that said foil leads are registered with the appropriate component terminal leads and bonded thereto.

9. An electronic watch module as claimed in claim 8 including:
one portion of said foil forming a battery connecting element for the module battery and having said film on the opposite side of said foil portion adapted to insulate said battery from a baseplate of said module.

10. An electronic watch module as claimed in claim 8 including:
said metallic foil being a copper strap adhered to said film.

* * * * *